United States Patent [19]

Liu et al.

(10) Patent No.: US 10,003,342 B2
(45) Date of Patent: Jun. 19, 2018

(54) COMPRESSOR CIRCUIT AND COMPRESSOR CIRCUIT LAYOUT

(71) Applicant: TAIWAN SEMICONDUCTOR MANUFACTURING COMPANY, LTD., Hsinchu (TW)

(72) Inventors: Chi-Lin Liu, New Taipei (TW);
Lee-Chung Lu, Taipei (TW);
Meng-Hsueh Wang, Hsinchu (TW);
Shang-Chih Hsieh, Yangmei (TW);
Henry Huang, Hsinchu (TW); Ji-Yung Lin, Hsinchu (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 257 days.

(21) Appl. No.: 14/740,499

(22) Filed: Jun. 16, 2015

(65) Prior Publication Data

US 2016/0156358 A1    Jun. 2, 2016

Related U.S. Application Data

(60) Provisional application No. 62/086,393, filed on Dec. 2, 2014.

(51) Int. Cl.
*H03K 19/21* (2006.01)
(52) U.S. Cl.
CPC .................................. *H03K 19/21* (2013.01)
(58) Field of Classification Search
CPC .............................. H03K 19/21; H03K 19/215
(Continued)

(56) References Cited

U.S. PATENT DOCUMENTS 3,838,393 A * 9/1974 Dao .................... H03K 19/0813
326/35
4,710,650 A * 12/1987 Shoji .................. H03K 19/0963
326/52

(Continued)

FOREIGN PATENT DOCUMENTS

KR   10-2002-0056222   7/2002

OTHER PUBLICATIONS

Y. Hagihara et al., "A 2.7ns 0.25μm CMOS 54×54b Multiplier", ISSCC98, SESSION18, Multimedia Progressors and Elements, Paper SA 18.5; pp. 296-297 and p. 449.

(Continued)

*Primary Examiner* — Don Le
(74) *Attorney, Agent, or Firm* — Hauptman Ham LLP

(57) ABSTRACT

A compressor circuit includes a plurality of inputs, a sum output, and a plurality of XOR circuits. Each XOR circuit of the plurality of XOR circuits includes first, second and third inputs, and a first output. The XOR circuit is configured to generate a logic value A⊕B⊕C at the first output, where A, B and C are logic values at the corresponding first, second and third inputs, and "⊕" is the XOR logic operation. The plurality of XOR circuits includes first and second XOR circuits. The first, second and third inputs of the first XOR circuit are coupled to corresponding inputs among the plurality of inputs of the compressor circuit. The first output of the first XOR circuit is coupled to the first input of the second XOR circuit. The first output of the second XOR circuit is coupled to the sum output.

20 Claims, 8 Drawing Sheets

(58) Field of Classification Search
USPC .......................................................... 326/52
See application file for complete search history.

(56) References Cited

U.S. PATENT DOCUMENTS

| | | | |
|---|---|---|---|
| 5,473,559 A | | 12/1995 | Makino |
| 5,541,865 A | * | 7/1996 | Ashkenazi .............. G06F 7/607 708/210 |
| 5,568,067 A | * | 10/1996 | McDermott ......... H03K 19/215 326/45 |
| 5,898,322 A | | 4/1999 | Kubota et al. |
| 6,578,063 B1 | | 6/2003 | Kojima et al. |
| 6,701,339 B2 | * | 3/2004 | Vangal .................... G06F 7/607 708/709 |
| 7,720,902 B2 | * | 5/2010 | Hirairi .................... G06F 7/509 708/708 |
| 8,421,205 B2 | | 4/2013 | Yang |
| 8,427,195 B1 | * | 4/2013 | Lee ........................ H03K 19/21 324/73.1 |
| 8,661,389 B2 | | 2/2014 | Chern et al. |
| 8,698,205 B2 | | 4/2014 | Tzeng et al. |
| 8,826,212 B2 | | 9/2014 | Yeh et al. |
| 8,836,141 B2 | | 9/2014 | Chi et al. |
| 2002/0129077 A1 | | 9/2002 | Rhee |
| 2014/0215420 A1 | | 7/2014 | Lin et al. |
| 2014/0264924 A1 | | 9/2014 | Yu et al. |
| 2014/0282289 A1 | | 9/2014 | Hsu et al. |
| 2014/0325466 A1 | | 10/2014 | Ke et al. |

OTHER PUBLICATIONS

Junji Mori et al., "A 10-ns 54×54-b Parallel Structured Full Array Multiplier with 0.5-μm CMOS Technology", IEEE Journal of Solid-State Circuits, vol. 26, No. 4. Apr. 1991, pp. 600-606.

Shen-Fu Hsiao et al., "Design of high-speed low-power 3-2 counter and 4-2 compressor for fast multipliers", Electronics Letters, Feb. 19, 1998, vol. 34, No. 4, pp. 341-343.

Kan M. Chu et al., "A Comparison of CMOS Circuit Techniques: Differential Cascade Voltage Switch Logic Versus Conventional Logic", IEEE Journal of Solid-State Circuits, vol. SC-22, No. 4, Aug. 1987, pp. 528-532.

Chip-Hong Chang et al., "Ultra Low-Voltage Low-Power CMOS 4-2 and 5-2 Compressors for Fast Arithmetic Circuits", IEEE Transactions on Circuits an D Systems-I: Regular Papers, vol. 51, No. 10, Oct. 2004, pp. 1985-1997.

Vojin G. OklobdZija, "Differential and Pass-Transistor CMOS Logic for High-Performance Systems", Proc 21st International Conference on Microelectronics (MIEL' 97), vol. 2, Nis, Yugoslavia, Sep. 14-17, 1997, pp. 803-810.

Kazuo Yano et al., "A 3.8-ns. CMOS 16×16-b Multiplier Using Complementary Pass-Transistor Logic", IEEE Journal of Solid-State Circuits, vol. 25. No. 2, Apr. 1990, pp. 388-395.

Office Action dated Oct. 4, 2016 from corresponding application No. TW 104138761.

Office Action dated Aug. 17, 2016 and English translation from corresponding application No. KR 10-2015-0156806.

* cited by examiner

COMPRESSOR CIRCUIT AND COMPRESSOR CIRCUIT LAYOUT

PRIORITY CLAIM

The instant application is a non-provisional application claiming the benefit of Provisional Application No. 62/086,393, filed Dec. 2, 2014. The entire content of Provisional Application No. 62/086,393 is incorporated by reference herein.

BACKGROUND

The recent trend in miniaturizing integrated circuits (ICs) has resulted in smaller devices which consume less power, yet provide more functionality at higher speeds than before. The miniaturization process has also resulted in various developments in IC designs and/or manufacturing processes to ensure production yield and intended performance. A multiplier is one of the basic components for an IC. Improvements in one or more of speed, power consumption, layout area, and similar properties of the multiplier also increase one or more of speed, power consumption, layout area, and similar properties of the IC.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
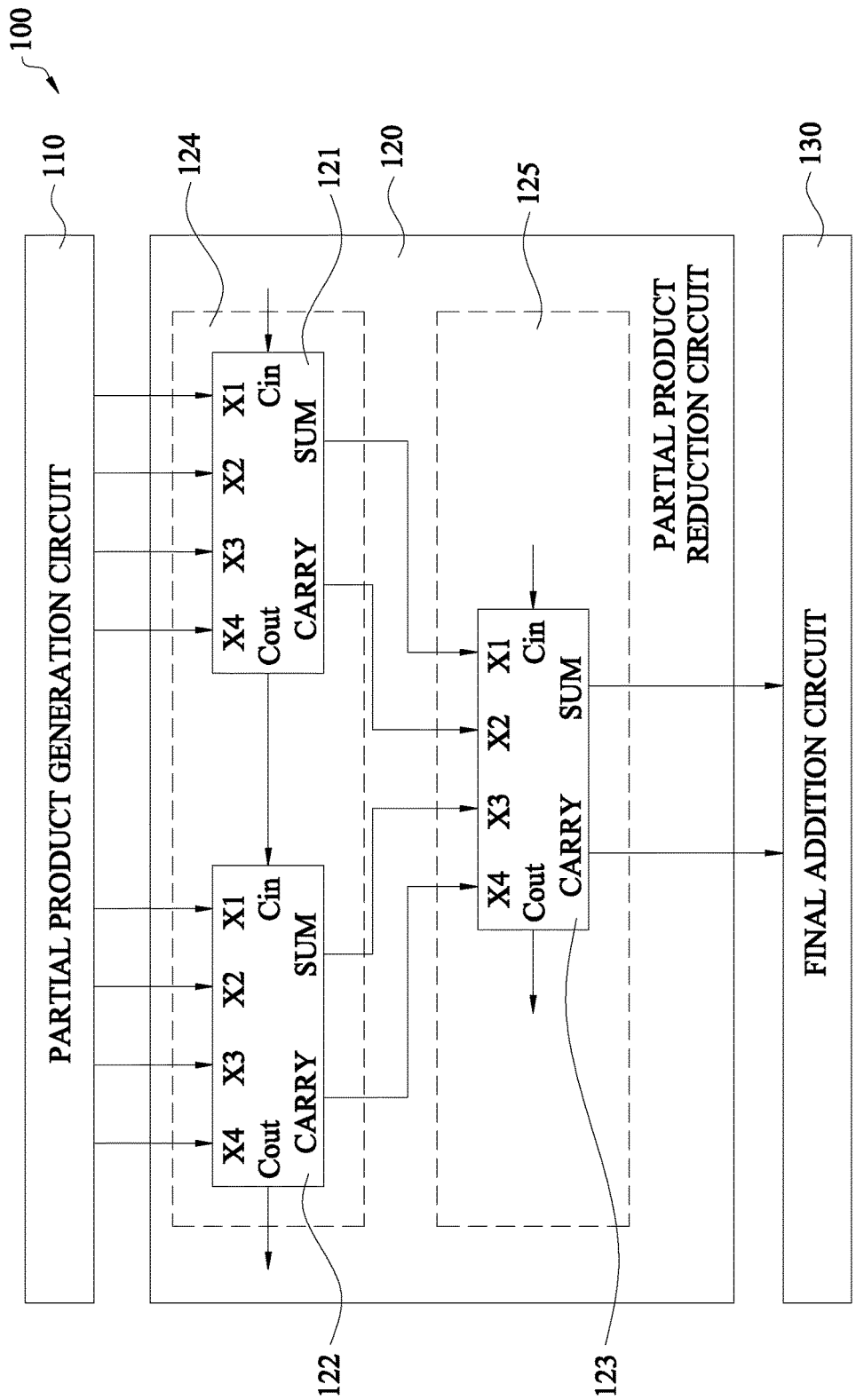
FIG. 1 is a block diagram of a multiplier, in accordance with some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, when a first element is described as being "connected" or "coupled" to a second element, such description includes embodiments in which the first and second elements are directly connected or coupled to each other, and also includes embodiments in which the first and second elements are indirectly connected or coupled to each other with one or more other intervening elements in between.

A multiplier comprises a partial product generation circuit, a partial product reduction circuit, and a final addition circuit. Partial products are generated by the partial product generation circuit from the numbers to be multiplied. The number of generated partial products is reduced by the partial product reduction circuit. The output results of the partial product reduction circuit corresponding to the reduced number of partial products are added by the final addition circuit to obtain the multiplication result. To reduce the number of partial products, the partial product reduction circuit comprises one or more compressor circuits.

In some embodiments, a compressor circuit comprises a plurality of XOR circuits. Each of the XOR circuits comprises first, second and third inputs, and a sum output. A logic value at the sum output corresponds to the XOR logic operation of logic values at the first, second and third inputs. The sum output of one of the XOR circuits is coupled to one of the inputs of another XOR circuit. A multiplier comprising one or more compressor circuits in accordance with some embodiments provides improvements in at least one of performance, power consumption, or chip area compared to other approaches.

FIG. 1 is a block diagram of a multiplier 100, in accordance with some embodiments. The multiplier 100 comprises a partial product generation circuit 110, a partial product reduction circuit 120, and a final addition circuit 130.

The partial product generation circuit 110 is configured to generate partial products from two numbers to be multiplied. An example circuit for the partial product generation circuit 110 comprises one or more AND gates. Other circuits are within the scope of various embodiments.

In at least one embodiment, when a first binary number having N bits is multiplied with a second binary number having M bits, the partial product generation circuit 110 generates M partial products each having N bits. When M and N are relatively small, it is possible in some situations to directly add the partial products to obtain a multiplication product. For example, when two binary numbers "1100" (corresponding to decimal number "12") and "1001" (corresponding to decimal number "9") are multiplied, four partial products "1100," "0000," "0000," and "1100" are generated and added to obtain a binary result "1101100" (corresponding to decimal number "108") as follows:

```
   1100
   1001
   ----
   1100
  0000
 0000
1100
-------
1101100
```

When M and N increase, the number of partial products, the number of bits in the partial products, and/or the number of addition steps also increase. In the multiplier 100, the partial product reduction circuit 120 is coupled to the partial product generation circuit 110, and is configured to receive the generated partial products and reduce the number of the partial products before outputting the partial products to the final addition circuit 130.

The partial product reduction circuit 120 comprises a plurality of compressor circuits. In the example configuration in FIG. 1, the partial product reduction circuit 120 comprises compressor circuits 121, 122, 123. The compressor circuits of the partial product reduction circuit 120 are arranged in one or more stages. In the example configuration in FIG. 2, the compressor circuits 121, 122 are arranged in a first stage 124, and the compressor circuit 123 is arranged in a second stage 125. The compressor circuits in the same stage, and in different stages, are coupled to each other in one or more manners described herein. The number of compressor circuits and/or stages in the partial product reduction circuit 120 in FIG. 1 are examples. Other numbers of compressor circuits and/or stages are within the scope of various embodiments.

Each of the compressor circuits in the partial product reduction circuit 120 comprises an n–2 compressor circuit, where n is a positive integer greater than 3, e.g., n=4, 5, 6, etc. An n–2 compressor circuit comprises n data inputs and two data outputs. In the example configuration in FIG. 2, the compressor circuits 121, 122 and 123 are 4-2 compressor circuits. However, other arrangements are within the scope of various embodiments. In an example, at least one of the compressor circuits of the partial product reduction circuit 120 comprises a compressor circuit other than a 4-2 compressor circuit. In a further example, the partial product reduction circuit 120 comprises compressor circuits having different n values.

A 4-2 compressor circuit, for example, the compressor circuit 121, comprises four data inputs X1, X2, X3 and X4, and two data outputs SUM and CARRY. The data output SUM is also referred to herein as the "sum output," and the data output CARRY is also referred to herein as the "carry output." The 4-2 compressor circuit further comprises an auxiliary input Cin and an auxiliary output Cout.

The data inputs of the compressor circuits in the first stage of the partial product reduction circuit 120 are coupled to receive corresponding bits of the corresponding partial products generated by the partial product generation circuit 110. For example, each of the data inputs X1, X2, X3 and X4 of the compressor circuit 121 and compressor circuit 122 is coupled to receive one bit of a partial product generated by the partial product generation circuit 110.

The data outputs of the compressor circuits in a stage of the partial product reduction circuit 120 are coupled to the data inputs of one or more compressor circuits in a subsequent stage, or to the final addition circuit 130. For example, the data outputs SUM and CARRY of the compressor circuit 121 in the first stage 124 are coupled to the corresponding data inputs X1, X2 of the compressor circuit 123 in the subsequent, second stage 125. The data outputs SUM and CARRY of the compressor circuit 122 in the first stage 124 are coupled to the corresponding data inputs X3, X4 of the compressor circuit 123 in the subsequent, second stage 125. The data outputs SUM and CARRY of the compressor circuit 123 are coupled to the final addition circuit 130.

The compressor circuits in the same stage are coupled to each other via the corresponding auxiliary inputs Cin and auxiliary outputs Cout. For example, in the first stage 124, the auxiliary input Cin of the compressor circuit 122 is coupled to the auxiliary output Cout of the compressor circuit 121 which is a preceding compressor circuit of the compressor circuit 122. In at least one embodiment, the auxiliary output Cout of the compressor circuit 122 is coupled to the auxiliary input Cin of another, subsequent compressor circuit in the first stage 124. In at least one embodiment, when the auxiliary input Cin of a compressor circuit is not coupled to the auxiliary output Cout of a preceding compressor circuit, a logic value at the auxiliary input Cin is logical "0." For example, a logic value at the auxiliary input Cin of the compressor circuit 121 which is not coupled to the auxiliary output Cout of a preceding compressor circuit is logical "0."

The described configuration, in which the compressor circuits of the partial product reduction circuit 120 are coupled in a Wallace tree, is an example. Other arrangements are within the scope of various embodiments. In one or more embodiments, at least one data input of a compressor circuit is not coupled to another component, and a logic value of the at least one data input is logical "0" in at least one embodiment. For example, the data input X1 of the compressor circuit 121 is not coupled to the partial product generation circuit 110 and/or the data input X4 of the compressor circuit 123 is not coupled to a data output of a compressor circuit in a preceding stage. In one or more embodiments, at least one data output of a compressor circuit in the first stage 124 is coupled to the final addition circuit 130, or to a data input of a compressor circuit in a stage subsequent to the second stage 125. In one or more embodiments, a bit of a partial product is supplied from the partial product generation circuit 110 to the final addition circuit 130, or to a data input of a compressor circuit in a stage subsequent to the first stage 124.

A 4-2 compressor circuit is configured to perform logical operations corresponding to the following logical expressions $$\text{Cout}=(X1 \cdot X2)+(X2 \cdot X3)+(X3 \cdot X1) \quad (1)$$

$$\text{SUM}=X1 \oplus X2 \oplus X3 \oplus X4 \oplus \text{Cin} \quad (2)$$

$$\text{CARRY}=((X1 \oplus X2 \oplus X3) \cdot \text{Cin})+(\text{Cin} \cdot X4)+(X4 \cdot (X1 \oplus X2 \oplus X3)) \quad (3)$$

where X1, X2, X3, X4, Cin, Cout, SUM and CARRY are corresponding logic values at the data inputs X1, X2, X3, X4, the auxiliary input Cin and auxiliary output Cout, and the data outputs SUM and CARRY, "$\oplus$" is the XOR logic operation, "·" is the AND logic operation, and "+" is the OR logic operation.

The final addition circuit 130 is configured to add compressed partial products outputted by the partial product reduction circuit 120. An example circuit for the final addition circuit 130 comprises one or more full adders. Other circuits are within the scope of various embodiments.

Figure 2:
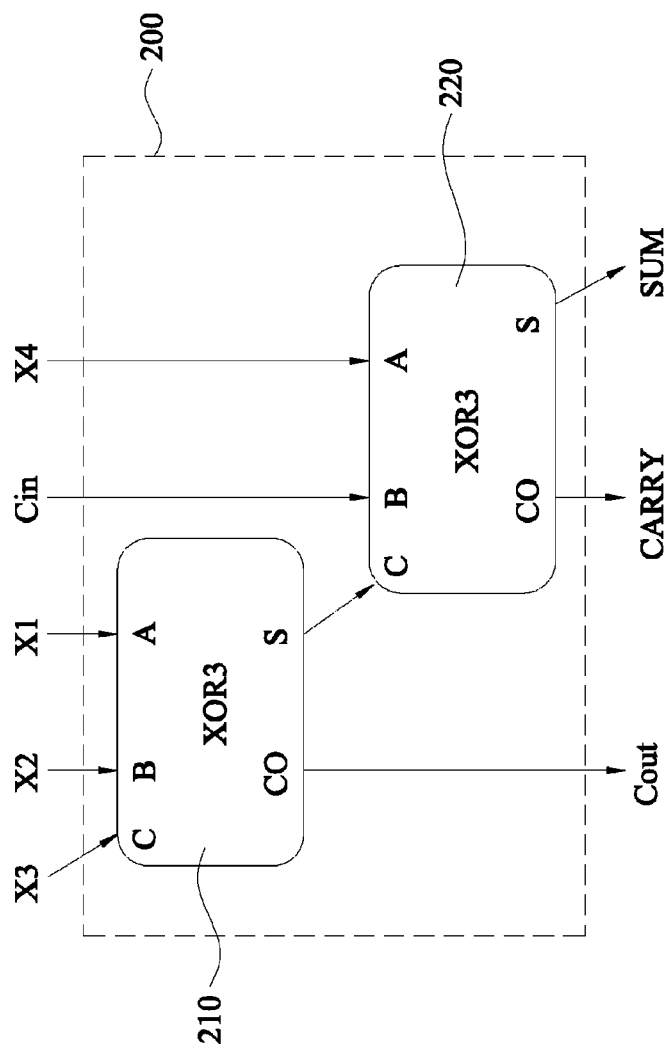
FIG. 2 is a block diagram of a compressor circuit for a multiplier, in accordance with some embodiments.

FIG. 2 is a block diagram of a compressor circuit 200 for a multiplier, in accordance with some embodiments. The compressor circuit 200 is a 4-2 compressor circuit corresponding to at least one of the compressor circuits 121, 112, 123, in accordance with some embodiments.

The compressor circuit 200 comprises a first XOR circuit 210 and a second XOR circuit 220. Each of the XOR circuits 210, 220 is a XOR3 circuit comprising three inputs A, B and C. Each of the XOR circuits 210, 220 further comprises two outputs S and CO.

The inputs of the first XOR circuit 210 are coupled to corresponding inputs of the compressor circuit 200. In the example configuration in FIG. 2, the inputs A, B and C of the first XOR circuit 210 are coupled to the corresponding data inputs X1, X2, and X3 of the compressor circuit 200. The described correspondence of the inputs A, B and C of the first XOR circuit 210 with the data inputs X1, X2, and X3 of the compressor circuit 200 is an example. Other arrangements are within the scope of various embodiments.

One of the inputs of the second XOR circuit 220 is coupled to the output S of the first XOR circuit 210, whereas the other two inputs of the second XOR circuit 220 are coupled corresponding inputs of the second XOR circuit 220. In the example configuration in FIG. 2, the input C of the second XOR circuit 220 is coupled to the output S of the first XOR circuit 210, whereas the inputs B and A of the second XOR circuit 220 are coupled to the corresponding auxiliary input Cin and the data input X4 of the compressor circuit 200. The described correspondence of the inputs C, B and A of the second XOR circuit 220 with the output S of the first XOR circuit 210 and the inputs Cin and X4 of compressor circuit 200 is an example. Other arrangements are within the scope of various embodiments.

The output CO of the first XOR circuit 210 is coupled to the auxiliary output Cout of the compressor circuit 200, the output CO of the second XOR circuit 220 is coupled to the output CARRY of the compressor circuit 200, and the output S of the second XOR circuit 220 is coupled to the output SUM of the compressor circuit 200.

Each of the XOR circuits 210, 220 is configured to perform logical operations corresponding to the following logical expressions:

$$S = A \oplus B \oplus C \quad (4)$$

$$CO = (A \cdot B) + (B \cdot C) + (C \cdot A) \quad (5)$$

where A, B, C, S and CO are corresponding logic values at the inputs A, B and C, and the outputs S and CO of the XOR circuit.

For the first XOR circuit 210, A=X1, B=X2, C=X3, and the corresponding logic values at the output S of the first XOR circuit 210 and the output Cout of compressor circuit 200 are as follows $$S = X1 \oplus X2 \oplus X3 \quad (6)$$

$$Cout = (X1 \cdot X2) + (X2 \cdot X3) + (X3 \cdot X1) \quad (7)$$

For the second XOR circuit 220, C=S of the first XOR circuit 210=X1⊕X2⊕X3, B=Cin, A=X4, and the corresponding logic values at the outputs SUM and CARRY of the compressor circuit 200 are as follows $$SUM = S \oplus X4 \oplus CIN = X1 \oplus X2 \oplus X3 \oplus X4 \oplus CIN \quad (8)$$

$$\begin{aligned} CARRY &= (S \cdot Cin) + (Cin \cdot X4) + (X4 \cdot S) \\ &= ((X1 \oplus X2 \oplus X3) \cdot Cin) + \\ &\quad (Cin \cdot X4) + (X4 \cdot (X1 \oplus X2 \oplus X3)) \end{aligned} \quad (9)$$

The logical expressions (7), (8) and (9) of the compressor circuit 200 comprising the XOR circuits 210, 220 match the corresponding logical expressions (1), (2) and (3) of the 4-2 compressor circuit described with respect to FIG. 1.

In some embodiments, the compressor circuit 200 has a simplified layout and/or a reduced chip area, compared to compressor circuits of the other approaches. The other approaches provide a compressor circuit including several types of circuits, such as XOR (XOR circuit with two inputs) and MUX (multiplexer). As a result, a layout of a compressor circuit in accordance with the other approaches is complex and/or occupies a relatively large chip area. In contrast, the compressor circuit 200 comprises XOR circuits 210, 220, which have substantially the same configuration, in accordance with some embodiments. As a result, a layout of the compressor circuit 200, in one or more embodiments, is simpler and/or occupies a smaller chip area than the compressor circuit in accordance with the other approaches.

Figure 3A:
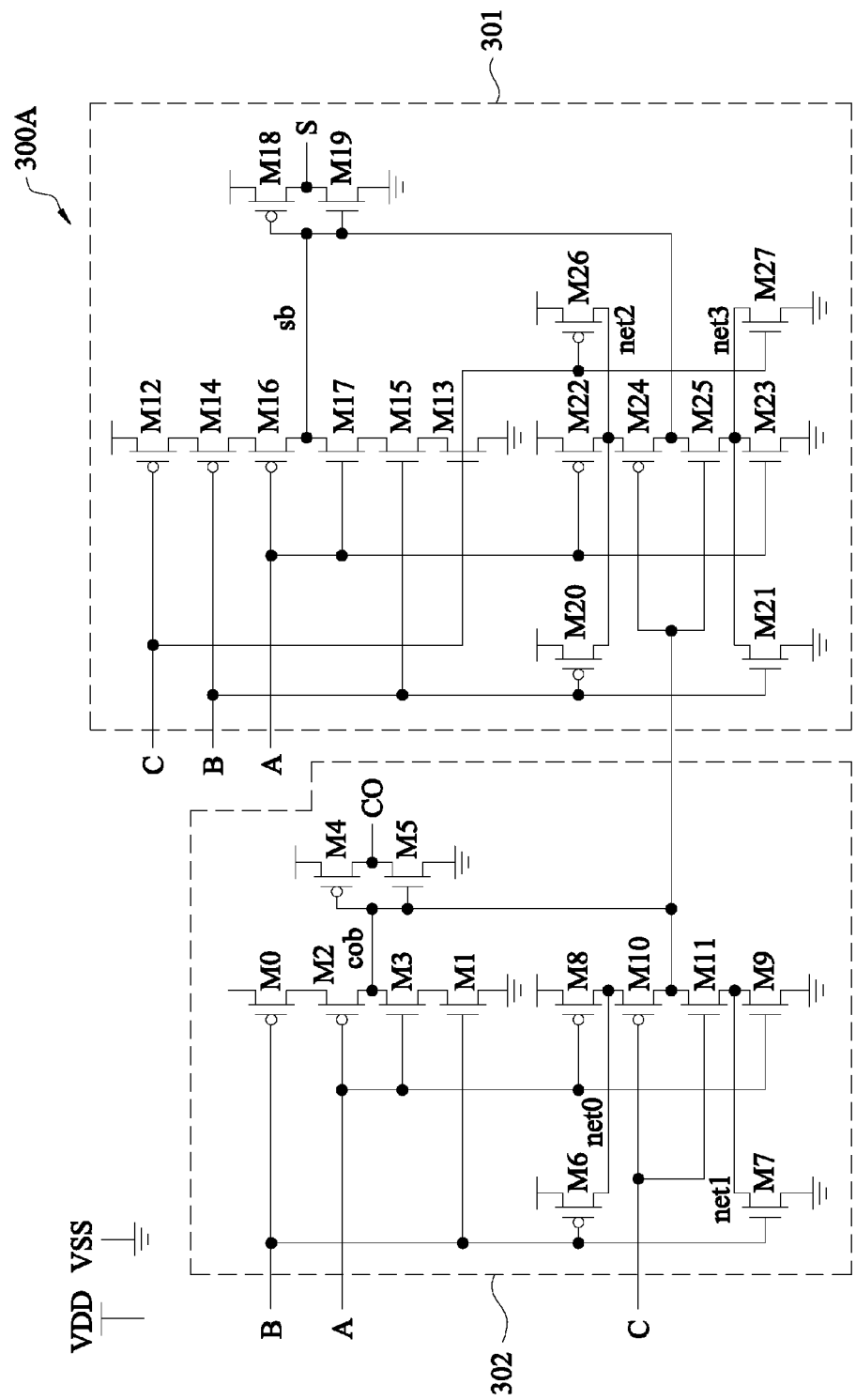
FIG. 3A is a circuit diagram of an XOR circuit for a compressor circuit, in accordance with some embodiments.

FIG. 3A is a circuit diagram of an XOR circuit 300A for a compressor circuit, in accordance with some embodiments. The XOR circuit 300A corresponds to at least one of the XOR circuits 210, 220, in accordance with some embodiments.

The XOR circuit 300A comprises a first circuit section 301 and a second circuit section 302. The first circuit section 301 is configured to perform logical operations corresponding to the logical expression (4). The second circuit section 302 is configured to perform logical operations corresponding to the logical expression (5). In the example configuration in FIG. 3A, the first circuit section 301 is coupled to the second circuit section 302 to receive a logic value at an intermediate node cob of the second circuit section 302, and to use the received logic value in performing logical operations corresponding to the logical expression (4). This arrangement is an example. Other arrangements are within the scope of various embodiments.

In the example configuration in FIG. 3A, the second circuit section 302 comprises transistors M0-M11, and the first circuit section 301 comprises transistors M12-M27 as described herein. The circuit configurations of the first circuit section 301 and/or the second circuit section 302 in FIG. 3A are examples. Other circuit configurations for performing logical operations corresponding to the logical expression (4) and/or the logical expression (5) are within the scope of various embodiments.

Examples of the transistors M0-M27 include, but are not limited to, metal oxide semiconductor field effect transistors (MOSFET), complementary metal oxide semiconductor (CMOS) transistors, bipolar junction transistors (BJT), high voltage transistors, high frequency transistors, p-channel and/or n-channel field effect transistors (PFETs/NFETs), FinFETs, planar MOS transistors with raised source/drains, or the like. In at least one embodiment, at least one of the transistors M0-M27 includes a p-channel metal-oxide semiconductor (PMOS) transistor, and at least another one of the transistors M0-M27 includes an n-channel metal-oxide semiconductor (NMOS) transistor. In the example configuration in FIG. 3A, the transistors M0, M2, M4, M6, M8, M10, M12, M14, M16, M18, M20, M22, M24 and M26 are PMOS transistors, and the transistors M1, M3, M5, M7, M9, M11, M13, M15, M17, M19, M21, M23, M25 and M27 are NMOS transistors. Other arrangements are within the scope of various embodiments.

The transistors M0, M2, M3 and M1 are coupled in series and in the recited order between a first power supply voltage node VDD (hereinafter "VDD" for simplicity) and a second power supply voltage node VSS (hereinafter "VSS" for simplicity). Specifically, VDD is coupled to a source of the transistor M0, a drain of the transistor M0 is coupled to a source of the transistor M2, a drain of the transistor M2 is coupled to a drain of the transistor M3, a source of the transistor M3 is coupled to a drain of the transistor M1, and a source of the transistor M1 is coupled to VSS. The transistors M2 and M3 have gates coupled to the input A. The transistors M0 and M1 have gates coupled to the input B.

The transistors M4 and M5 are coupled in series between VDD and VSS. Specifically, VDD is coupled to a source of the transistor M4, a drain of the transistor M4 is coupled to a drain of the transistor M5, and a source of the transistor M5 is coupled to VSS. The transistors M4 and M5 have gates coupled to the intermediate node cob between the transistors M2 and M3. The drain of the transistor M2 is coupled to the drain of the transistor M3 at the node cob. The output CO is coupled to a node where the drain of the transistor M4 is coupled to the drain of the transistor M5. In the example configuration in FIG. 3A, the transistors M4 and M5 form an inverter, and a logic value at the output CO is inverted from a logic value at the node cob.

The transistors M6 and M7 have gates coupled to the input B. The transistors M8, M10, M9 and M11 are coupled in series and in the recited order between VDD and VSS, in a manner similar to that described with respect to the transistors M0, M2, M3 and M1. The transistors M10 and M11 have gates coupled to the input C. The transistors M8 and M9 have gates coupled to the input A. The transistors M6 and M8 are coupled in parallel between VDD and an intermediate node net0. Specifically, sources of the transistors M6 and M8 are coupled to VDD, and drains of the transistors M6 and M8 are coupled to the intermediate node net0. The transistors M7 and M9 are coupled in parallel between VSS and an intermediate node net1. Specifically, sources of the transistors M7 and M9 are coupled to VSS, and drains of the transistors M7 and M9 are coupled to the intermediate node net1. The node cob is coupled to the drain of the transistor M10 and the drain of the transistor M11.

The transistors M12, M14, M16, M17, M15, and M13 are coupled in series and in the recited order between VDD and VSS, in a manner similar to that described with respect to the transistors M0, M2, M3 and M1. The transistors M12 and M13 have gates coupled to the input C. The transistors M14 and M15 have gates coupled to the input B. The transistors M16 and M17 have gates coupled to the input A.

The transistors M18 and M19 are coupled in series between VDD and VSS, in a manner similar to that described with respect to the transistors M4, M5. The transistors M18 and M19 have gates coupled to an intermediate node sb between the transistors M16 and M17. The drain of the transistor M16 is coupled to the drain of the transistor M17 at the node sb. The output S is coupled to the drain of the transistor M18 and the drain of the transistor M19. In the example configuration in FIG. 3A, the transistors M18 and M19 form an inverter, and a logic value at the output S is inverted from a logic value at the node sb.

The transistors M20, M22 and M26 are coupled in parallel between VDD and an intermediate node net2, in a manner similar to that described with respect to the transistors M6, M8. The transistors M20, M22 and M26 have gates coupled to the corresponding input B, input A and input C. The transistors M21, M23 and M27 are coupled in parallel between VSS and an intermediate node net3, in a manner similar to that described with respect to the transistors M7, M9. The transistors M21, M23 and M27 have gates coupled to the corresponding input B, input A and input C.

The transistors M24 and M25 have gates coupled to the node cob. The node sb coupled to the drains of the transistors M24 and M25. The transistors M22, M24, M25 and M23 are coupled in series and in the recited order between VDD and VSS, in a manner similar to that described with respect to the transistors M8, M10, M11 and M9.

The XOR circuit 300A is configured to generate a logic value corresponding to the logical expression (5) at the output CO, and a logic value corresponding to the logical expression (4) at the output S.

Figure 3B:
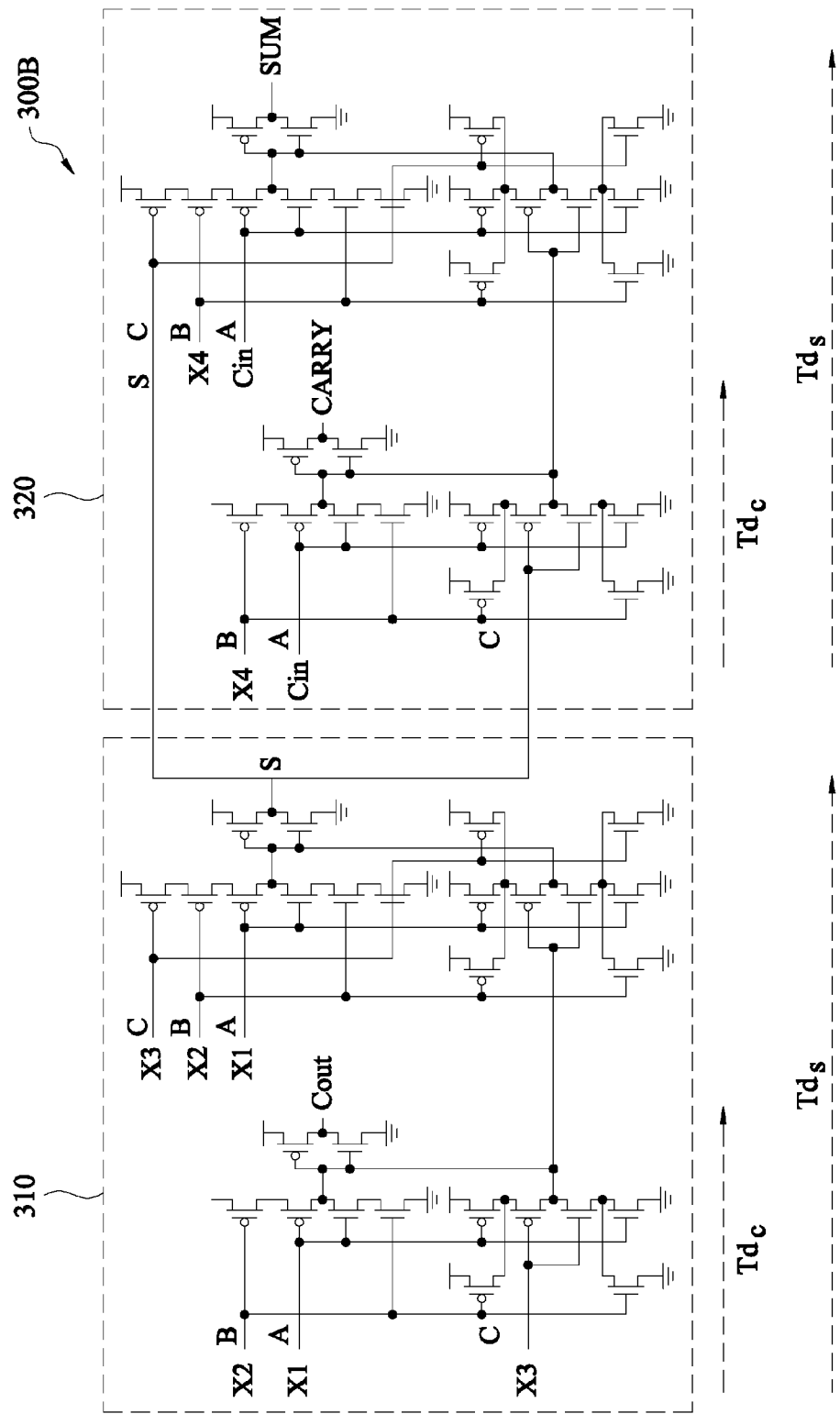
FIG. 3B is a circuit diagram of a compressor circuit, in accordance with some embodiments.

FIG. 3B is a circuit diagram of a compressor circuit 300B, in accordance with some embodiments. The compressor circuit 300B comprises a first XOR circuit 310, and a second XOR circuit 320. In some embodiments, each of the first XOR circuit 310 and the second XOR circuit 320 corresponds to the XOR circuit 300A described with respect to FIG. 3A. In some embodiments, the first XOR circuit 310 corresponds to the first XOR circuit 210, the second XOR circuit 320 corresponds to the second XOR circuit 220, and the compressor circuit 300B corresponds to the compressor circuit 200 described with respect to FIG. 2.

As described with respect to the first XOR circuit 210 in FIG. 2, the inputs A, B and C of the first XOR circuit 310 are coupled to the corresponding data inputs X1, X2 and X3 of the compressor circuit 300B, the output CO of the first XOR circuit 310 is coupled to the auxiliary output Cout of the compressor circuit 300B, and the output S of the first XOR circuit 310 is coupled to the input C of the second XOR circuit 320.

As described with respect to the second XOR circuit 220 in FIG. 2, the input A and the input B of the second XOR circuit 320 are coupled to the corresponding auxiliary input Cin and data input X4, the output CO of the second XOR circuit 320 is coupled to the output CARRY, the output S of the second XOR circuit 320 is coupled to the output SUM of the compressor circuit 300B.

The compressor circuit 300B is configured to generate a logic value corresponding to the logical expression (1) at the auxiliary output Cout, a logic value corresponding to the logical expression (2) at the output SUM, and a logic value corresponding to the logical expression (3) at the output CARRY.

In some embodiments, each of the first XOR circuit 310 and the second XOR circuit 320 has a time delay Tdc from data input via the corresponding inputs A, B, C to data output at the corresponding output CO, i.e., the auxiliary output Cout of the first XOR circuit 310 and the output CARRY of the second XOR circuit 320. Each of the first XOR circuit 310 and the second XOR circuit 320 further has a time delay Tds from data input via the corresponding inputs A, B, C to data output at the corresponding output S, i.e., the output S of the first XOR circuit 310 and the output SUM of the second XOR circuit 320. In at least one embodiment, Tds is greater than Tdc as illustrate in FIG. 3B. For the compressor circuit 300B which is a 4-2 compressor circuit, a critical path time delay $Td_{CMPE42}$ from data input via the corresponding inputs X1-X4 and Cin to data output at the output SUM is about two times Tds, i.e., 2×Tds. In at least one embodiment, assuming all transistors in the compressor circuit 300B have about the same gate delay, Tdc is about 2 gate delays, Tds is about 3 gate delays, and $Td_{CMPE42}$ is about 6 gate delays.

As noted herein, some other approaches use various circuits, such as XOR, MUX, transmission gate (TG), in a compressor circuit. As a result, the layout and/or routing of the compressor circuit in accordance with the other approaches are complex and increase the time delay of the compressor circuit. In contrast, the compressor circuit in accordance with some embodiments comprises XOR circuits. In one or more embodiments, such an arrangement simplifies routing and improves the time delay and speed of the compressor circuit compared to the compressor circuit of the other approaches. The compressor circuit in one or more embodiments includes no TGs and no MUXs.

Figure 4A:
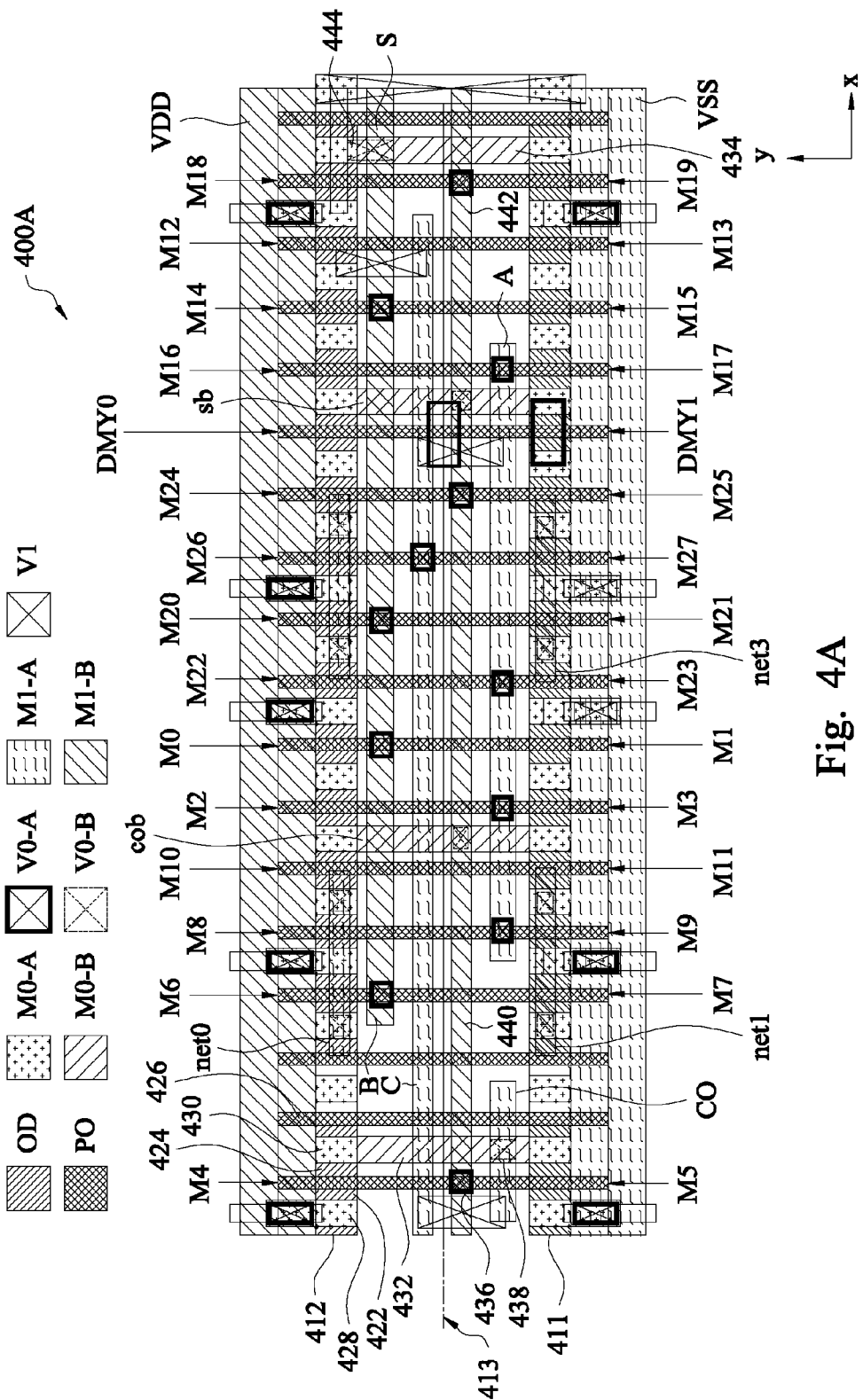
FIG. 4A is a layout of an XOR circuit for a compressor circuit, in accordance with some embodiments.

FIG. 4A is a layout 400A of an XOR circuit for a compressor circuit, in accordance with some embodiments. The layout 400A corresponds to at least one of the XOR circuits 310, 320, in accordance with some embodiments. For example, in the following description, the layout 400A corresponds to the second XOR circuit 320. With respect to various layouts described herein, a description that a first pattern or element of a layout is electrically coupled to a second pattern or element of the layout means that, in a physical chip or device corresponding to the layout, a first physical feature corresponding to the first pattern or element is electrically coupled to a second physical feature corresponding to the second pattern or element.

The layout 400A comprises a first active area region 411, and a second active area region 412. The active area regions 411, 412 extend along a first direction of the layout 400A, e.g., the X direction. In some embodiments, the active area regions 411, 412 are also referred to as oxide-definition (OD) regions, and are schematically illustrated in the drawings with the label "OD." The first active area region 411 comprises sources and drains of the NMOS transistors M1, M3, M5, M7, M9, M11, M13, M15, M17, M19, M21, M23, M25 and M27. The second active area region 412 comprises sources and drains of the PMOS transistors M0, M2, M4, M6, M8, M10, M12, M14, M16, M18, M20, M22, M24 and M26. In the example configuration in FIG. 4A, the NMOS transistors and the PMOS transistors are arranged symmetrically with respect to each other across a central line 413 between the active area regions 411, 412. For this reason, XOR circuit having the layout 400A is referred to in some embodiments as a mirror adder.

Example materials of the active area regions 411, 412 include, but are not limited to, semiconductor materials doped with various types of p-dopants and/or n-dopants. In at least one embodiment, the active area regions 411, 412 include dopants of the same type. In at least one embodiment, one of the active area regions 411, 412 comprises dopants of a type different from a type of dopants of another one of the active area regions 411, 412. The active area regions 411, 412 are isolated from each other by one or more isolation structures. The active area regions 411, 412 are within corresponding well regions. For example, the active area region 411 is within a p-well region in one or more embodiments, and the active area region 412 is within an n-well region in one or more embodiments. The described conductivity of the well regions is an example. Other arrangements are within the scope of various embodiments.

The layout 400A further comprises a plurality of gate electrodes overlapping the active area regions 411, 412, and extending along a second direction of the layout 400A, e.g., the Y direction, between the active area regions 411, 412. For simplicity, the gate electrodes in FIG. 4A are indicated by the reference numerals of the corresponding transistors. For example, the gate electrode indicated by the arrow associated with the reference numeral "M4" comprises the gate of the transistor M4. The same gate electrode is further indicated by the arrow associated with the reference numeral "M5" to indicate that this gate electrode also comprises the gate of the transistor M5. The described arrangement where the same gate electrode comprises the gates of the transistors M4, M5 corresponds to the description in FIG. 3A, where the gates of the transistors M4 and M5 are coupled to each other. Example materials of the gate electrodes include, but are not limited to, polysilicon and metal. Other materials are within the scope of various embodiments. The gate electrodes are referred to herein in one or more embodiments as poly (PO) patterns and are schematically illustrated in the drawings with the label "PO."

Each transistor in the layout 400A further comprises a source and a drain (referred to herein as "source/drain") in the corresponding active area region 411 or 412 and on opposite sides of the corresponding gate electrode. For example, the transistor M4 comprises a source 422 and a drain 424 in the corresponding second active area region 412, and on opposite sides of the corresponding gate electrode M4. Some adjacent transistors share a source/drain. For example, the source/drain between the transistors M2 and M0 is configured as both the drain of the transistor M0 and the source of the transistor M2. The described arrangement corresponds to the description in FIG. 3A, where the drain of the transistor M0 and the source of the transistor M2 are coupled to each other.

In the example configuration in FIG. 4A, one or more gate electrodes do not correspond to a transistor, and are referred to herein as dummy gates. For example, reference numeral 426 indicates a dummy gate which does not correspond to a transistor, and lacks a drain or a source at one side thereof. In at least one embodiment, one or more dummy gates are included in the layout 400A for routing improvements and/or for one or more other design considerations. In at least one embodiment, dummy gates are omitted from the layout 400A.

In the example configuration in FIG. 4A, the layout 400A further comprises one or more dummy transistors. For example, two dummy transistors DMY0 and DMY1 are included in the layout 400A. Each of the dummy transistors DMY0 and DMY1 has a drain, a source and a gate electrically coupled to each other. For example, the gate, drain and source of the dummy transistor DMY1 are electrically coupled to each other by a conductive pattern 427. The dummy transistors DMY0 and DMY1 are included in the layout 400A for routing improvements and/or for one or more other design considerations. In at least one embodiment, dummy transistors are omitted from the layout 400A.

The layout 400A further comprises a plurality of source/drain contacts. The source/drain contacts electrically couple the underlying source/drains of the corresponding transistors with each other or with other circuitry. For example, a source/drain contact 428 is over and electrically coupled to the source 422 and a source/drain contact 430 is over and electrically coupled to the drain 424 of the transistor M4. In at least one embodiment, the source/drain contacts comprise a metal and belong to a first metal layer, referred to herein as the metal-zero layer, which is the lowermost metal layer of an IC comprising the XOR circuit of the layout 400A. The source/drain contacts are schematically illustrated in the drawings with the label "M0-A."

The layout 400A further comprises a plurality of further conductive patterns in the metal-zero layer. Such further conductive patterns are schematically illustrated in the drawings with the label "M0-B." For example, a conductive pattern 432 electrically couples the drain of the transistor M4 and the source of the transistor M5. A further conductive pattern corresponds to the node cob described with respect to FIG. 3A, and is also designated in FIG. 4A as cob. The conductive pattern cob electrically couples the drain of the transistor M10 and the source of the transistor M11. A further conductive pattern corresponds to the node sb described with respect to FIG. 3A, and is also designated in FIG. 4A as sb. The conductive pattern sb electrically couples the drain of the transistor M16 and the source of the transistor M17. A further conductive pattern 434 electrically couples the drain of the transistor M18 and the source of the transistor M19. The conductive pattern 434 corresponds to the output S described with respect to FIG. 3A.

The layout 400A further comprises a via-zero (V0) layer over the underlying metal-zero layer and gate electrodes. In at least one embodiment, the V0 layer is the lowermost via layer of the IC comprising the XOR circuit of the layout 400A. The V0 layer comprises a plurality of V0 vias over and electrically coupled to the corresponding, underlying gate electrodes. For example, a V0 via 436 is over and electrically coupled to the corresponding, underlying gate electrode of the transistors M4, M5. The V0 vias over and electrically coupled to the gate electrode are schematically illustrated in the drawings with the label "V0-A." The V0 layer further comprises a plurality of V0 vias over and electrically coupled to the corresponding, underlying metal-zero layer. For example, a V0 via 438 is over and electrically coupled to the conductive pattern 432 of the metal-zero layer. The V0 vias over and electrically coupled to the metal-zero layer are schematically illustrated in the drawings with the label "V0-B."

The layout 400A further comprises a metal-one layer over the V0 layer. In at least one embodiment, the metal-one layer is the second lowermost metal layer of the IC comprising the XOR circuit of the layout 400A. In the example configuration in FIG. 4A, the metal-one layer comprises two sets of conductive patterns extending in the X direction. The first set of conductive patterns of the metal-one layer is schematically illustrated in the drawings with the label "M1-A" and comprises conductive patterns VSS, A, CO, C, net0 and net2 corresponding to VSS, input A, output CO, input C, node net0 and node net2 described with respect to FIG. 3A. The second set of conductive patterns of the metal-one layer is schematically illustrated in the drawings with the label "M1-B" and comprises conductive patterns VDD, B, 440, 442, net1 and net3. The conductive patterns VDD, B, net1 and net3 correspond to VDD, input B, node net1 and node net3 described with respect to FIG. 3A. The conductive patterns 440 and 442 are described herein.

Each of the conductive patterns of the metal-one layer is electrically coupled to a corresponding underlying conductive pattern of the metal-zero layer or to a corresponding underlying gate electrode through a V0 via. For example, the conductive pattern net0 is electrically coupled to the drain of the transistor M6 through a corresponding V0 via, and to the shared source/drain of the transistors M8, M10 through another V0 via. The conductive pattern 440 is electrically coupled to the underlying gate electrode of the transistors M4, M5 through the V0 via 436, to the underlying conductive pattern cob thru another V0 via, and to the gate electrode of the transistors M24, M25 through a further V0 via. The conductive pattern 442 is electrically coupled to the underlying gate electrode of the transistors M18, M19 through a V0 via, and to the underlying conductive pattern sb thru another V0 via. Although the conductive patterns 440, 442 are illustrated as being continuous to each other in the layout 400A, the conductive patterns 440, 442 are disconnected and electrically isolated from each other.

The inputs of the XOR circuit of the layout 400A comprise conductive patterns A, B and C. The conductive pattern A corresponding to the input A described with respect to FIG. 3A is electrically coupled to the gate electrode of the transistors M8, M9, the gate electrode of the transistors M2, M3, the gate electrode of the transistors M22, M23, and the gate electrode of the transistors M16, M17 through corresponding V0 vias. The conductive pattern B corresponding to the input B described with respect to FIG. 3A is electrically coupled to the gate electrode of the transistors M6, M7, the gate electrode of the transistors M0, M1, the gate electrode of the transistors M20, M21, and the gate electrode of the transistors M14, M15 through corresponding V0 vias. The conductive pattern C corresponding to the input C described with respect to FIG. 3A is electrically coupled to the gate electrode of the transistors M10, M11, the gate electrode of the transistors M26, M27, and the gate electrode of the transistors M12, M13 through corresponding V0 vias. The conductive patterns A, B and C are electrically coupled to other circuitry through corresponding vias of a via-one (V1) layer over the underlying metal-one layer. Some V1 vias are schematically illustrated in the drawings with the label "V1."

The outputs of the XOR circuit of the layout 400A comprise outputs S and CO. The output S comprises a conductive pattern of the metal-one layer. The output S is aligned with, but disconnected and electrically isolated from, the conductive pattern B. The output S is electrically coupled to the conductive pattern 434 of the metal-zero layer through a corresponding V0 via 444. The output CO comprises a conductive pattern of the metal-one layer. The output CO is aligned with, but disconnected and electrically isolated from, the conductive pattern A. The output CO is electrically coupled to the conductive pattern 432 of the metal-zero layer through the corresponding V0 via 438. In the example configuration in FIG. 4A, the output S and the output CO are arranged at opposite ends of the XOR circuit in the X direction. Other arrangements are within the scope of various embodiments.

In some embodiments, the layout 400A is represented by a plurality of masks generated by one or more processors and/or stored in one or more non-transitory computer-readable media. Other formats for representing the layout 400A are within the scope of various embodiments. Examples of a non-transitory computer readable recording medium include, but are not limited to, external/removable and/or internal/built-in storage or memory unit, e.g., one or more of an optical disk, such as a DVD, a magnetic disk, such as a hard disk, a semiconductor memory, such as a ROM, a RAM, a memory card, and the like. For example, the layout 400A is presented by at least one mask corresponding to the active area regions 411, 412, at least one mask corresponding to the gate electrodes, at least one mask corresponding to the metal-zero layer, at least one mask corresponding to the V0 layer, and at least one mask corresponding to the metal-one layer. In some embodiments, the metal-one layer comprises two masks corresponding to the two sets of conductive patterns M1-A and M1-B illustrated in FIG. 4A.

Figure 4B:
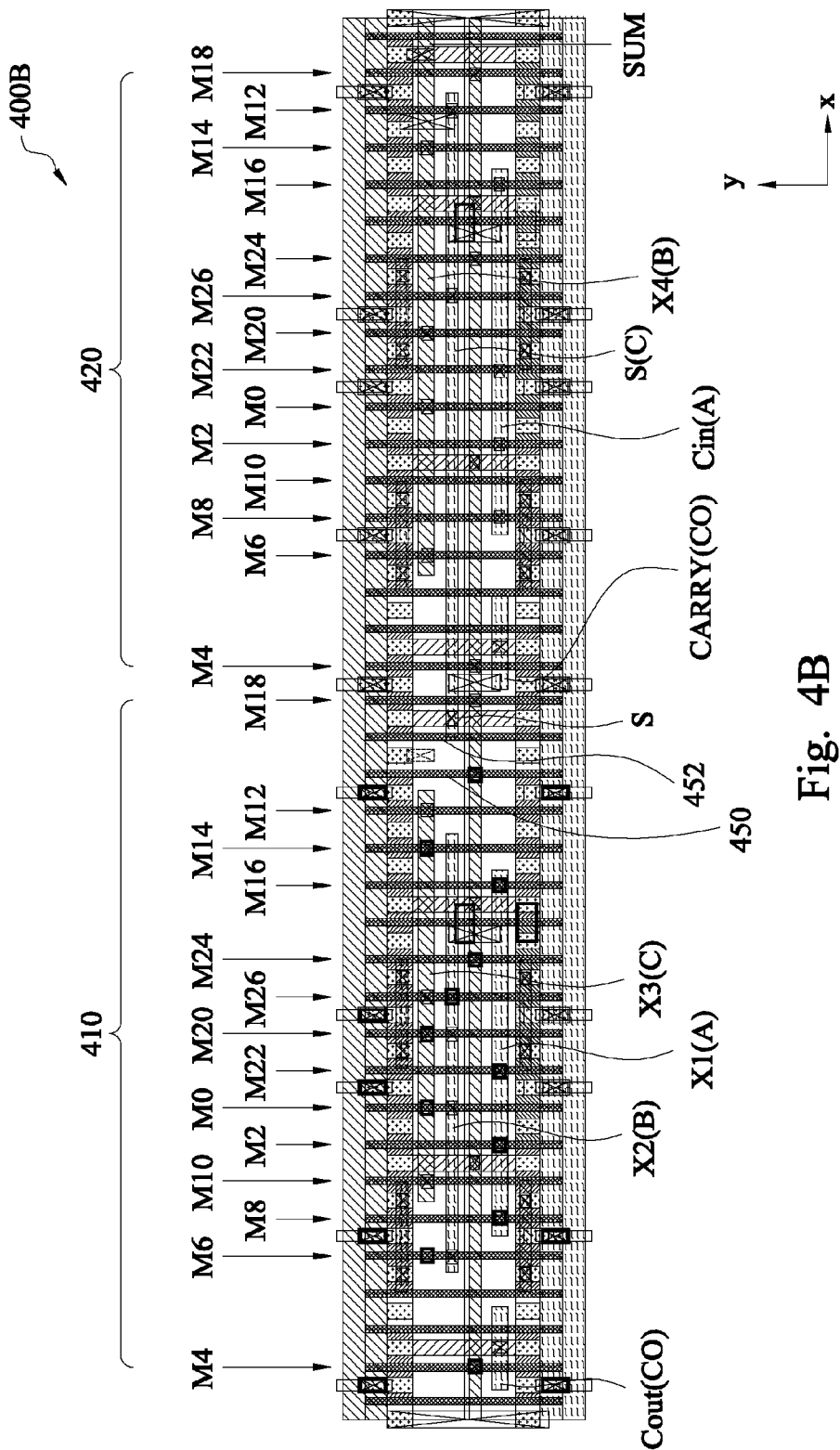
FIG. 4B is a layout of a compressor circuit, in accordance with some embodiments.

FIG. 4B is a layout 400B of a compressor circuit, in accordance with some embodiments. In at least one embodiment, the compressor circuit of the layout 400B corresponds to the compressor circuit 300B described with respect to FIG. 3B.

The layout 400B comprises a first XOR circuit 410, and a second XOR circuit 420. In at least one embodiment, the first XOR circuit 410 corresponds to the first XOR circuit 310, and the second XOR circuit 420 corresponds to the second XOR circuit 320 described with respect to FIG. 3B. The second XOR circuit 420 corresponds to the layout 400A described with respect to FIG. 4A. For simplicity, reference numerals of the NMOS transistors are omitted in FIG. 4B.

The transistors in the first XOR circuit 410 are arranged and coupled to each other substantially as in the second XOR circuit 420. A difference between the first XOR circuit 410 and the second XOR circuit 420 includes the inclusion of two dummy gates 450, 452 between the transistor M12 and the transistor M18 in the first XOR circuit 410. In at least one embodiment, the dummy gates 450, 452 are omitted.

Another difference between the first XOR circuit 410 and the second XOR circuit 420 includes the arrangements of the conductive patterns B and C. In the second XOR circuit 420, as best seen FIG. 4A, the conductive pattern B is arranged farther from the conductive pattern A than the conductive pattern C. In the first XOR circuit 410, the conductive patterns B and C switch place, and the conductive pattern C is arranged farther from the conductive pattern A than the conductive pattern B.

The output S of the second XOR circuit 420 is electrically coupled to the conductive pattern C of the first XOR circuit 410. In the example configuration in FIG. 4B, a single conductive pattern extends continuously in the X direction from the first XOR circuit 410 to the second XOR circuit 420, and comprises both the output S of the first XOR circuit 410 and the conductive pattern C of the second XOR circuit 420. The data inputs X1-X4, auxiliary input Cin, auxiliary output Cout, output CARRY and output SUM in the layout 400B are coupled to the corresponding inputs and outputs of the XOR circuits 410, 420 as described with respect to FIG. 3B.

As noted herein, the compressor circuit in accordance with some embodiments has a simplified layout and/or routing. A reason, in at least one embodiment, resides in the symmetrical arrangement of the PMOS and NMOS transistors. The simplified routing permits a reduction in the number of dummy transistors. In the example configuration in FIG. 4B, the compressor circuit in one or more embodiments comprises 4 dummy transistors, compared to 14 dummy transistors in accordance with other approaches. As a result, the compressor circuit in one or more embodiments occupies a smaller chip area. In the example configuration in FIG. 2, the compressor circuit in at least one embodiment occupies an area corresponding to 38 gate pitches, compared to 66 gate pitches in accordance with other approaches. About 42% of area reduction is achievable in at least one embodiment. The simplified routing and or reduced chip area further reduce the critical path time delay of the compressor circuit and/or power consumption. In one or more embodiments, time delay is improved by about 17-41% and/or power consumption is improved by about 53% compared to other approaches. The compressor circuit in accordance with some embodiments is applicable to advanced manufacturing nodes. For example, the compressor circuit in one or more embodiments comprises FinFET transistors manufactured at node 10 (10 nm) which is difficult to achieve in other approaches due to complex routing.

Figure 5:
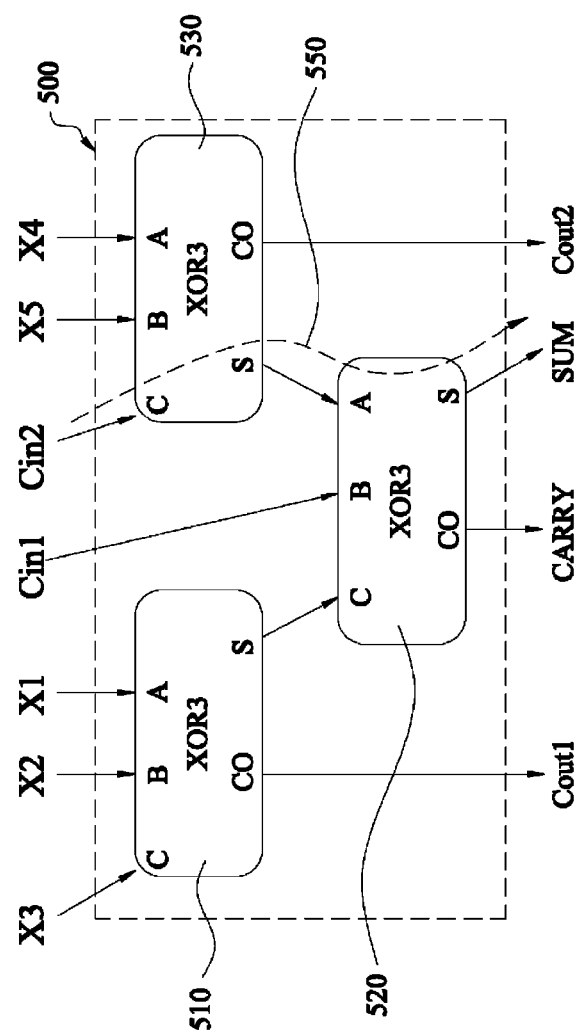
FIG. 5 is a block diagram of a compressor circuit for a multiplier, in accordance with some embodiments.

FIG. 5 is a block diagram of a compressor circuit 500 for a multiplier, in accordance with some embodiments. The compressor circuit 500 comprises a 5-2 compressor circuit having five data inputs X1-X5, and two data outputs SUM and CARRY. The compressor circuit 500 further comprises two auxiliary inputs Cin1, Cin2, and two auxiliary outputs Cout1, Cout2. The auxiliary inputs Cin1, Cin2 are configured to be coupled to corresponding auxiliary outputs Cout1, Cout2 of at least one preceding compressor circuit, and the two auxiliary outputs Cout1, Cout2 are configured to be coupled to corresponding auxiliary inputs Cin1, Cin2 of at least one subsequent compressor circuit as described with respect to FIG. 1.

Compared to the 4-2 compressor circuit 200 which comprises two XOR circuits, the 5-2 compressor circuit 500 comprises three XOR circuits, namely, XOR circuits 510, 520, 530. In at least one embodiment, at least one of the XOR circuits 510, 520, 530 has the same configuration as at least one of the XOR circuits 210, 220. In at least one embodiment, at least one of the XOR circuits 510, 520, 530 corresponds to the XOR circuit 300A and/or has a layout corresponding to the layout 400A.

The inputs A, B and C of the first XOR circuit 510 are coupled to the corresponding data inputs X1, X2, and X3 of the compressor circuit 500. The described correspondence of the inputs A, B and C of the first XOR circuit 510 with other nodes of the compressor circuit 500 is an example. Other arrangements are within the scope of various embodiments.

The second XOR circuit 520 has a first input coupled to the output S of the first XOR circuit 510, a second input coupled to the output S of the third XOR circuit 530, and a third input coupled to an auxiliary input of the compressor circuit 500. In the example configuration in FIG. 5, the second XOR circuit 520 has the input C coupled to the output S of the first XOR circuit 510, the input A coupled to the output S of the third XOR circuit 530, and the input B coupled to the corresponding auxiliary input Cin1 of the compressor circuit 500. The described correspondence of the inputs A, B and C of the second XOR circuit 520 with other nodes of the compressor circuit 500 is an example. Other arrangements are within the scope of various embodiments.

The third XOR circuit 530 has inputs coupled to corresponding auxiliary and data inputs of the compressor circuit 500. In the example configuration in FIG. 5, the third XOR circuit 530 has the inputs A and B coupled to the corresponding data inputs X4, X5, and the input C coupled to the auxiliary input Cin2 of the compressor circuit 500. The described correspondence of the inputs A, B and C of the third XOR circuit 530 with other nodes of the compressor circuit 500 is an example. Other arrangements are within the scope of various embodiments.

The output CO of the first XOR circuit 510 is coupled to the auxiliary output Cout1 of the compressor circuit 500, the output CO of the second XOR circuit 520 is coupled to the output CARRY of the compressor circuit 500, the output S of the second XOR circuit 520 is coupled to the output SUM of the compressor circuit 500, and the output CO of the third XOR circuit 530 is coupled to the auxiliary output Cout2 of the compressor circuit 500.

In some embodiments, a critical path time delay $Td_{CMPE52}$ of the 5-2 compressor circuit 500 is along a path 550 from the auxiliary input Cin2 of the compressor circuit 500, to the input C of the third XOR circuit 530, to the output S of the third XOR circuit 530, to the input A of the second XOR circuit 520, and via the output S of the second XOR circuit 520 to the output SUM of the compressor circuit 500. The time delay $Td_{CMPE52}$ comprises a time delay Tdc caused by a preceding compressor circuit at the auxiliary input Cin2, a time delay Tds caused by the third XOR circuit 530, and another time delay Tds caused by the second XOR circuit 520. Accordingly, $Td_{CMPE52}=Tdc+2\times Tds$. In at least one embodiment, assuming that Tdc is about 2 gate delays and Tds is about 3 gate delays, $Td_{CMPE52}$ is about 8 gate delays, i.e., about $4/3\times Td_{CMPE42}$.

In some other approaches, due to complex layout and/or routing, a critical path time delay of a 5-2 compressor circuit is greater than 4/3 times a critical path time delay of a 4-2 compressor circuit. Given that the 4-2 compressor circuit in accordance with some embodiments already achieves speed improvement over 4-2 compressor circuits in accordance with other approaches, the 5-2 compressor circuit in accordance with some embodiments achieves further speed improvement over 5-2 compressor circuits in accordance with other approaches. In some embodiments, one or more effects described with respect to FIGS. 2-4B is/are achievable in the compressor circuit 500.

Figure 6:
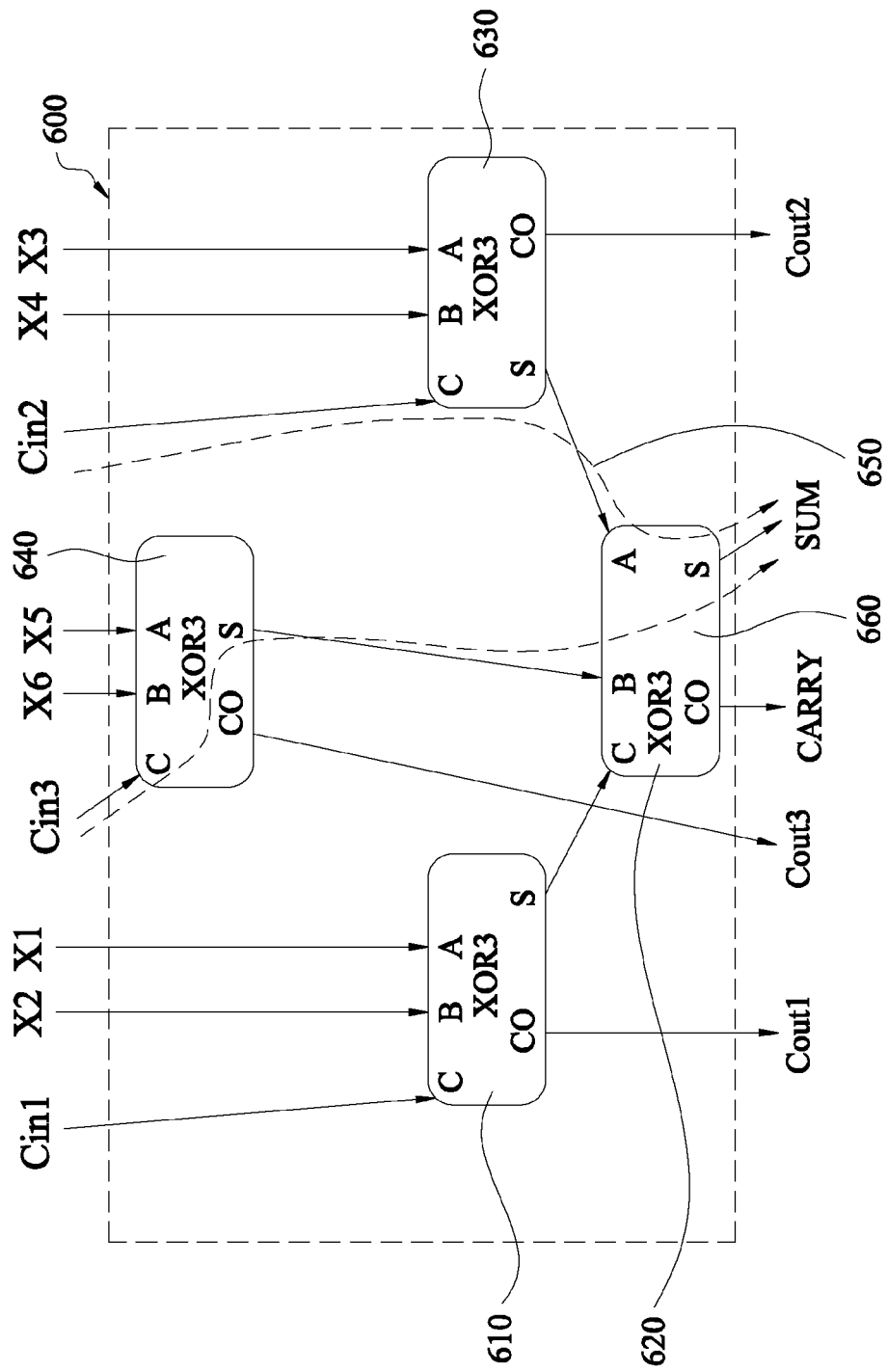
FIG. 6 is a block diagram of a compressor circuit for a multiplier, in accordance with some embodiments.

FIG. 6 is a block diagram of a compressor circuit 600 for a multiplier, in accordance with some embodiments. The compressor circuit 600 comprises a 6-2 compressor circuit having six data inputs X1-X6, and two data outputs SUM and CARRY. The compressor circuit 600 further comprises three auxiliary inputs Cin1, Cin2, Cin3 and three auxiliary outputs Cout1, Cout2, Cout3. The auxiliary inputs Cin1, Cin2, Cin3 are configured to be coupled to corresponding auxiliary outputs Cout1, Cout2, Cout3 of at least one preceding compressor circuit, and the auxiliary outputs Cout1, Cout2, Cout3 are configured to be coupled to corresponding auxiliary inputs Cin1, Cin2, Cin3 of at least one subsequent compressor circuit as described with respect to FIG. 1.

Compared to the 5-2 compressor circuit 500 which comprises three XOR circuits, the 6-2 compressor circuit 600 comprises four XOR circuits, namely, XOR circuits 610, 620, 630, 640. In at least one embodiment, at least one of the XOR circuits 610, 620, 630, 640 has the same configuration as at least one of the XOR circuits 210, 220. In at least one embodiment, at least one of the XOR circuits 610, 620, 630, 640 corresponds to the XOR circuit 300A and/or has a layout corresponding to the layout 400A.

The inputs A, B and C of the first XOR circuit 610 are coupled to the corresponding data inputs X1, X2, and the auxiliary input Cin1 of the compressor circuit 600. The described correspondence of the inputs A, B and C of the first XOR circuit 610 with other nodes of the compressor circuit 600 is an example. Other arrangements are within the scope of various embodiments.

The second XOR circuit 620 has inputs coupled to the outputs S of the XOR circuits 610, 630, 640. In the example configuration in FIG. 6, the second XOR circuit 620 has the input C coupled to the output S of the first XOR circuit 610, the input A coupled to the output S of the third XOR circuit 630, and the input B coupled to the output S of the fourth XOR circuit 640. The described correspondence of the inputs A, B and C of the second XOR circuit 620 with other nodes of the compressor circuit 600 is an example. Other arrangements are within the scope of various embodiments.

The inputs A, B and C of the third XOR circuit 630 are coupled to the corresponding data inputs X3, X4, and the auxiliary input Cin2 of the compressor circuit 600. The described correspondence of the inputs A, B and C of the third XOR circuit 630 with other nodes of the compressor circuit 600 is an example. Other arrangements are within the scope of various embodiments.

The inputs A, B and C of the fourth XOR circuit 640 are coupled to the corresponding data inputs X5, X6, and the auxiliary input Cin3 of the compressor circuit 600. The described correspondence of the inputs A, B and C of the fourth XOR circuit 640 with other nodes of the compressor circuit 600 is an example. Other arrangements are within the scope of various embodiments.

The outputs CO of the XOR circuits 610, 630, 640 are coupled to the corresponding auxiliary output Cout1, Cout2, Cout3 of the compressor circuit 600. The output CO of the second XOR circuit 620 is coupled to the output CARRY of the compressor circuit 600, and the output S of the second XOR circuit 620 is coupled to the output SUM of the compressor circuit 600.

In some embodiments, a critical path time delay $Td_{CMPE62}$ of the 6-2 compressor circuit 600 is along a path 650 or a path 660. The path 650 is similar to the path 550 described with respect to FIG. 5. The path 660 is from the auxiliary input Cin3 of the compressor circuit 600, to the input C of the fourth XOR circuit 640, to the output S of the fourth XOR circuit 640, to the input B of the second XOR circuit 620, and via the output S of the second XOR circuit 620 to the output SUM of the compressor circuit 600. In at least one embodiment, the time delay $Td_{CMPE62}$ along either of the paths 650, 660 comprises a time delay Tdc caused by a preceding compressor circuit at the auxiliary input Cin2 or Cin3, a time delay Tds caused by the third XOR circuit 630 or the fourth XOR circuit 640, and another time delay Tds caused by the second XOR circuit 620. Accordingly, $Td_{CMPE62}=Tdc+2\times Tds$ which is the same as $Td_{CMPE52}$ of the 5-2 compressor circuit 500 in one or more embodiments. In at least one embodiment, assuming that Tdc is about 2 gate delays and Tds is about 3 gate delays, $Td_{CMPE62}$ is about 8 gate delays, i.e., about $4/3\times Td_{CMPE42}$.

In some embodiments, a critical path time delay of a multiplier is evaluated as $Td_{CMPE}\times \log_{(x/y)}(N/2)$, where $Td_{CMPE}$ is the critical path time delay of a compressor circuit used in the multiplier, (x/y) is the logarithm base, x is the number of data inputs of the compressor circuit, y is the number of data outputs of the compressor circuit, and N is the number of input bits of the multiplier. For a 4-2 compressor circuit, x=4, y=2, and the logarithm base is 2. For a 5-2 compressor circuit, x=5, y=2 and the logarithm base is 2.5. For a 6-2 compressor circuit, x=6, y=2 and the logarithm base is 3. At a higher logarithm base (x/y), $\log_{(x/y)}(N/2)$ is reduced. As result, the overall speed of a multiplier comprising 6-2 compressor circuits in accordance with some embodiments is further improved over multipliers in accordance with other approaches which often experience difficulties in realizing compressor circuits at high (x/y), e.g., at x=6, due to complex routing. In some embodiments, one or more effects described with respect to FIGS. 2-5 is/are achievable in the compressor circuit 600.

Embodiments that combine different features and/or different embodiments are within the scope of the disclosure and will be apparent to those of ordinary skill in the art after reviewing various embodiments.

Some embodiments provide a compressor circuit which comprises a plurality of XOR3 circuits. A logic value at a sum output of each XOR3 circuit corresponds to the XOR logic operation of logic values at first, second and third inputs of the XOR3 circuits. The sum output of one of the XOR3 circuits is coupled to one of the inputs of another XOR3 circuit. In some embodiments, improvements in one or more of speed, chip area, power consumption, and layout/routing simplicity are achievable.

In some embodiments, a compressor circuit comprises a plurality of inputs, a sum output, and a plurality of XOR circuits. Each XOR circuit of the plurality of XOR circuits comprises first, second and third inputs, and a first output. The XOR circuit is configured to generate a logic value A⊕B⊕C at the first output, where A, B and C are logic values at the corresponding first, second and third inputs, and "⊕" is the XOR logic operation. The plurality of XOR circuits comprises first and second XOR circuits. The first, second and third inputs of the first XOR circuit are coupled to corresponding inputs among the plurality of inputs of the compressor circuit. The first output of the first XOR circuit is coupled to the first input of the second XOR circuit. The first output of the second XOR circuit is coupled to the sum output.

In some embodiments, a compressor circuit comprises a plurality of circuits. Each circuit among the plurality of circuits comprises first, second and third inputs, first and second outputs, and first and second circuit sections. The first circuit section is coupled to the first, second and third inputs and to the first output. The first circuit section is configured to generate a logic value A⊕B⊕C at the first output, where A, B and C are logic values at the corresponding first, second and third inputs, and "⊕" is the XOR logic operation. The second circuit section is coupled to the first, second and third inputs and to the second output. The second circuit section is configured to generate a logic value (A·B)+(B·C)+(C·A) at the second output, where "·" is the AND logic operation, and "+" is the OR logic operation. The first output of a first circuit among the plurality of circuits is coupled to one input among the first, second and third inputs of a second circuit among the plurality of circuits.

In some embodiments, a layout of a compressor circuit is stored on a non-transitory computer-readable medium. The layout comprises a first XOR circuit, and a second XOR circuit. Each XOR circuit of the first and second XOR circuits is configured to generate a logic value A⊕B⊕C at a first output, where A, B and C are logic values at corresponding first, second and third inputs, and "⊕" is the XOR logic operation. Each XOR circuit of the first and second XOR circuits comprises first and second active area regions, a plurality of gate electrodes, and a plurality of conductive patterns. The first active area region extends in a first direction and comprises sources and drains of a plurality of NMOS transistors. The second active area region extends in the first direction and comprises sources and drains of a plurality of PMOS transistors. The plurality of gate electrodes extends between the first and second active area regions in a second direction transverse to the first direction. Each gate electrode among the plurality of gate electrodes comprises a gate of a PMOS transistor among the plurality of PMOS transistors and a gate of a corresponding NMOS transistor among the plurality of NMOS transistors. The plurality of conductive patterns extends in the first direction and is arranged between the first and second active area regions. The plurality of conductive patterns corresponds to the first input, second input and third input. The first output of the first XOR circuit is coupled to the conductive pattern corresponding to one of the first input, second input or third input of the second XOR circuit.

The foregoing outlines features of several embodiments so that those of ordinary skill in the art may better understand the aspects of the present disclosure. Those of ordinary skill in the art should appreciate that they may readily use the present disclosure as a basis for designing or modifying other circuits, processes and structures for carrying out the same purposes and/or achieving the same advantages of the embodiments introduced herein. Those of ordinary skill in the art should also realize that such equivalent constructions do not depart from the spirit and scope of the present disclosure, and that they may make various changes, substitutions, and alterations herein without departing from the spirit and scope of the present disclosure.

What is claimed is:

1. A compressor circuit, comprising:
a plurality of inputs;
a sum output; and
a plurality of XOR circuits, each XOR circuit of the plurality of XOR circuits comprising:
first, second and third inputs; and
a first output, the XOR circuit configured to generate a logic value A⊕B⊕C at the first output, where A, B and C are logic values at the corresponding first, second and third inputs, "⊕" is the XOR logic operation, and the logic value is based solely on A, B, and C,
wherein
the plurality of XOR circuits comprises first and second XOR circuits,
the first, second and third inputs of the first XOR circuit are coupled to corresponding inputs among the plurality of inputs of the compressor circuit,
the first output of the first XOR circuit is coupled to the first input of the second XOR circuit, and
the first output of the second XOR circuit is coupled to the sum output.

2. The compressor circuit of claim 1, further comprising:
a carry output configured to be coupled to an input of a further compressor circuit, wherein
each XOR circuit of the plurality of XOR circuits further comprises a second output, the XOR circuit is configured to generate a logic value (A·B) +(B·C) +(C·A) at the second output, where "·" is the AND logic operation, and "+" is the OR logic operation, and
the second output of the second XOR circuit is coupled to the carry output.

3. The compressor circuit of claim 2, further comprising:
an auxiliary output configured to be coupled to an auxiliary input of a subsequent compressor circuit,
wherein the second output of the first XOR circuit is coupled to the auxiliary output.

4. The compressor circuit of claim 3, wherein
the plurality of inputs of the compressor circuit comprises an auxiliary input configured to be coupled to an auxiliary output of a preceding compressor circuit, and
the second input of the second XOR circuit is coupled to the auxiliary input.

5. The compressor circuit of claim 4, wherein
the compressor circuit is a 4-2 compressor circuit and has first through fourth data inputs among the plurality of inputs of the compressor circuit, and
the first, second and third inputs of the first XOR circuit and the third input of the second XOR circuit are coupled to the corresponding first through fourth data inputs.

6. The compressor circuit of claim 2, wherein
the plurality of XOR circuits further comprises a third XOR circuit, and
the first output of the third XOR circuit is coupled to the third input of the second XOR circuit.

7. The compressor circuit of claim 6, further comprising:
first and second auxiliary outputs configured to be coupled to corresponding auxiliary inputs of at least one subsequent compressor circuit,
wherein
the second output of the first XOR circuit is coupled to the first auxiliary output, and
the second output of the third XOR circuit is coupled to the second auxiliary output.

8. The compressor circuit of claim 7, wherein
the plurality of inputs of the compressor circuit comprises first and second auxiliary inputs configured to be coupled to corresponding auxiliary outputs of at least one preceding compressor circuit,
the second input of the second XOR circuit is coupled to the first auxiliary input, and
the first input of the third XOR circuit is coupled to the second auxiliary input.

9. The compressor circuit of claim 8, wherein
the compressor circuit is a 5-2 compressor circuit and has first through fifth data inputs among the plurality of inputs of the compressor circuit, and
the first, second and third inputs of the first XOR circuit, and the second and third inputs of the third XOR circuit are coupled to the corresponding first through fifth data inputs.

10. The compressor circuit of claim 6, wherein
the plurality of XOR circuits further comprises a fourth XOR circuit, and
the first output of the fourth XOR circuit is coupled to the second input of the second XOR circuit.

11. The compressor circuit of claim 10, further comprising:
first, second and third auxiliary outputs configured to be coupled to corresponding auxiliary inputs of at least one subsequent compressor circuit,
wherein
the second output of the first XOR circuit is coupled to the first auxiliary output,
the second output of the third XOR circuit is coupled to the second auxiliary output, and
the second output of the fourth XOR circuit is coupled to the third auxiliary output.

12. The compressor circuit of claim 11, wherein
the plurality of inputs of the compressor circuit comprises first, second and third auxiliary inputs configured to be coupled to corresponding auxiliary outputs of at least one preceding compressor circuit,
the first input of the first XOR circuit is coupled to the first auxiliary input,
the first input of the third XOR circuit is coupled to the second auxiliary input, and
the first input of the fourth XOR circuit is coupled to the third auxiliary input.

13. The compressor circuit of claim 12, wherein
the compressor circuit is a 6-2 compressor circuit and has first through sixth data inputs among the plurality of inputs of the compressor circuit, and
the second and third inputs of the first XOR circuit, the second and third inputs of the third XOR circuit, and the second and third inputs of the fourth XOR circuit are coupled to the corresponding first through sixth data inputs.

14. A compressor circuit, comprising:
a plurality of circuits,
wherein each circuit among the plurality of circuits comprises:
first, second and third inputs,
first and second outputs,
a first circuit section coupled to the first, second and third inputs and to the first output, the first circuit section configured to generate a logic value A⊕B⊕C at the first output, where A, B and C are logic values at the corresponding first, second and third inputs, "⊕" is the XOR logic operation, and the logic value is based solely on A, B, and C, and
a second circuit section coupled to the first, second and third inputs and to the second output, the second circuit section configured to generate a logic value (A·B)+(B·C)+(C·A) at the second output, where "·" is the AND logic operation, and "+" is the OR logic operation, and wherein the first output of a first circuit among the plurality of circuits is coupled to one input among the first, second and third inputs of a second circuit among the plurality of circuits.

15. The compressor circuit of claim 14, wherein each circuit among the plurality of circuits comprises transistors M0-M27,
the first circuit section comprising the transistors M12-M27,
the second circuit section comprising the transistors M0-M11,
the transistors M0, M1, M2 and M3 coupled in series between a first power supply voltage node and a second power supply voltage node, the transistors M2 and M3 having gates coupled to the first input, the transistors M0 and M1 having gates coupled to the second input,
the transistors M4 and M5 coupled in series between the first power supply voltage node and the second power supply voltage node, the transistors M4 and M5 having gates coupled to a first intermediate node between the transistors M2 and M3, a node between the transistors M4 and M5 coupled to the second output,
the transistors M6 and M7 having gates coupled to the second input,
the transistors M8, M9, M1 and M11 coupled in series between the first power supply voltage node and the second power supply voltage node, the transistors M10 and M11 having gates coupled to the third input, the transistors M8 and M9 having gates coupled to the first input,
the transistors M6 and M8 coupled in parallel between the first power supply voltage terminal and a second intermediate node,
the transistors M7 and M9 coupled in parallel between the second power supply voltage terminal and a third intermediate node,
the first intermediate node coupled to a node between the transistors M10 and M11,
the transistors M12, M13, M14, M15, M16 and M17 coupled in series between the first power supply voltage node and the second power supply voltage node, the transistors M12 and M13 having gates coupled to the third input, the transistors M14 and M15 having gates coupled to the second input, the transistors M16 and M17 having gates coupled to the first input,
the transistors M18 and M19 coupled in series between the first power supply voltage node and the second power supply voltage node, the transistors M18 and M19 having gates coupled to a fourth intermediate node between the transistors M16 and M17, a node between the transistors M18 and M19 coupled to the first output,
the transistors M20, M22 and M26 coupled in parallel between the first power supply voltage terminal and a fifth intermediate node, the transistors M20, M22 and M26 having gates coupled to the corresponding second input, first input and third input,
the transistors M21, M23 and M27 coupled in parallel between the second power supply voltage terminal and a sixth intermediate node, the transistors M21, M23 and M27 having gates coupled to the corresponding second input, first input and third input,
the transistors M24 and M25 having gates coupled to the first intermediate node, the fourth intermediate node coupled to a node between the transistors M24 and M25, and the transistors M22, M23, M24 and M25 coupled in series between the first power supply voltage node and the second power supply voltage node.

16. The compressor circuit of claim 15, wherein
the first output of a third circuit among the plurality of circuits is coupled to another input among the first, second and third inputs of the second circuit.

17. The compressor circuit of claim 16, wherein
the first output of a fourth circuit among the plurality of circuits is coupled to another input among the first, second and third inputs of the second circuit.

18. The compressor circuit of claim 15, wherein
the transistors M0, M2, M4, M6, M8, M10, M12, M14, M16, M18, M20, M22, M24 and M26 are p-channel metal-oxide semiconductor (PMOS) transistors, and
the transistors M1, M3, M5, M7, M9, M11, M13, M15, M17, M19, M21, M23, M25 and M27 are n-channel metal-oxide semiconductor (NMOS) transistors.

19. A semiconductor device comprising:
a first XOR circuit; and
a second XOR circuit, wherein
each XOR circuit of the first and second XOR circuits is configured to generate a logic value A⊕B⊕C at a first output, where A, B and C are logic values at corresponding first, second and third inputs, and "⊕" is the XOR logic operation,
each XOR circuit of the first and second XOR circuits comprises
a first active area extending in a first direction and comprising sources and drains of a plurality of n-channel metal-oxide semiconductor (NMOS) transistors,
a second active area extending in the first direction and comprising sources and drains of a plurality of p-channel metal-oxide semiconductor (PMOS) transistors,
a plurality of gate electrodes overlying the first and second active areas, and extending between the first and second active areas in a second direction transverse to the first direction, each gate electrode among the plurality of gate electrodes comprising a gate of a PMOS transistor among the plurality of PMOS transistors and a gate of a corresponding NMOS transistor among the plurality of NMOS transistors,
a plurality of conductive elements extending in the first direction and arranged between the first and second active areas, the plurality of conductive elements corresponding to the first input, second input and third input, and
the first output of the first XOR circuit is coupled to the conductive element corresponding to one of the first input, second input or third input of the second XOR circuit.

20. The semiconductor device of claim 19, wherein
each XOR circuit of the first and second XOR circuits is configured to generate a logic value (A·B) +(B·C) +(C·A) at a second output, where "·" is the AND logic operation, and "+" is the OR logic operation, and
in each XOR circuit of the first and second XOR circuits, the first and second outputs are arranged at opposite ends of the XOR circuit in the first direction.

* * * * *